United States Patent [19]
Schutten et al.

[11] Patent Number: 4,558,243
[45] Date of Patent: Dec. 10, 1985

[54] BIDIRECTIONAL POWER FET WITH SHORTING-CHANNEL OFF STATE

[75] Inventors: Herman P. Schutten, Milwaukee; James A. Benjamin, Waukesha, both of Wis.; Robert W. Lade, Fort Myers, Fla.

[73] Assignee: Eaton Corporation, Cleveland, Ohio

[21] Appl. No.: 608,401

[22] Filed: May 9, 1984

[51] Int. Cl.[4] .......................................... H03K 17/60
[52] U.S. Cl. ................... 307/584; 307/252 B; 307/304; 357/23.4; 357/39; 357/41; 357/43; 357/55; 357/86
[58] Field of Search .................... 357/23.4, 38, 39, 41, 357/43, 55, 86; 307/570, 571, 577, 584, 304, 252 B

[56] References Cited
U.S. PATENT DOCUMENTS

| | | | |
|---|---|---|---|
| 4,199,774 | 4/1980 | Plummer | 357/39 |
| 4,414,560 | 11/1983 | Lidow | 357/39 |
| 4,487,457 | 12/1984 | Janutka | 307/570 |
| 4,488,068 | 12/1984 | Janutka | 307/577 |

OTHER PUBLICATIONS

J. Plummer et al., "Insulated Gate Planar Thyristors," IEEE Trans. on Elec. Dev., vol. ED-27, #2, Feb. 1980.

Primary Examiner—Joseph E. Clawson, Jr.
Attorney, Agent, or Firm—Andrus, Sceales, Starke & Sawall

[57] ABSTRACT

A gating technique during the OFF state is disclosed for split gate bidirectional power FET structure 2, including AC application. First and second conduction channels 14 and 16 are gated OFF to stop conduction. One of the channels such as 14 is then gated back ON to short an otherwise forward biased junction 18 between a common drift region 4 and the respective channel-containing region 6, to prevent minority carrier injection and consequent bipolar action. OFF state voltage is blocked by the reverse biased junction 20 between the drift region 4 and the other channel-containing region 8. The OFF state voltage blocking capability is higher without the forward biased injection junction 18.

8 Claims, 2 Drawing Figures

BIDIRECTIONAL POWER FET WITH SHORTING-CHANNEL OFF STATE

BACKGROUND AND SUMMARY

The invention relates to power switching semi-conductors, and more particularly to power MOSFETs (metal oxide semiconductor field effect transistors), and the like.

The present invention relates to an improved gating technique providing increased OFF state voltage blocking capability in AC power FET structure such as shown in copending application Ser. Nos. 390,562, and 390,479, filed June 12, 1982, and Ser. No. 421,931, filed Sept. 23, 1982. These Applications disclose lateral FET structure for bidirectional power switching, including AC application. Laterally spaced source regions and channel regions have a common drift region therebetween. Upon application of voltage of either polarity across main terminals connected to the source regions, current flow in either direction is controlled by the potential on split gate electrode means proximate the channels.

The present invention provides a gating technique during the OFF state for preventing minority carrier injection and bipolar action. During the OFF state, one of the channels is gated ON to short an otherwise forward biased junction between the one channel-containing region and the drift region, to prevent minority carrier injection. The OFF state blocking voltage is dropped across the reversed biased junction between the drift region and the other channel-containing region. The OFF state blocking voltage is higher without the forward biased injection junction and the bipolar action therefrom.

The gating ON of the one channel during the OFF state also attracts given polarity carriers in the drift region adjacent the one channel to prevent unwanted inversion to the other polarity type along an induced depletion path through the drift region. This further enhances OFF state voltage blocking capability.

DETAILED DESCRIPTION

Figure 1:
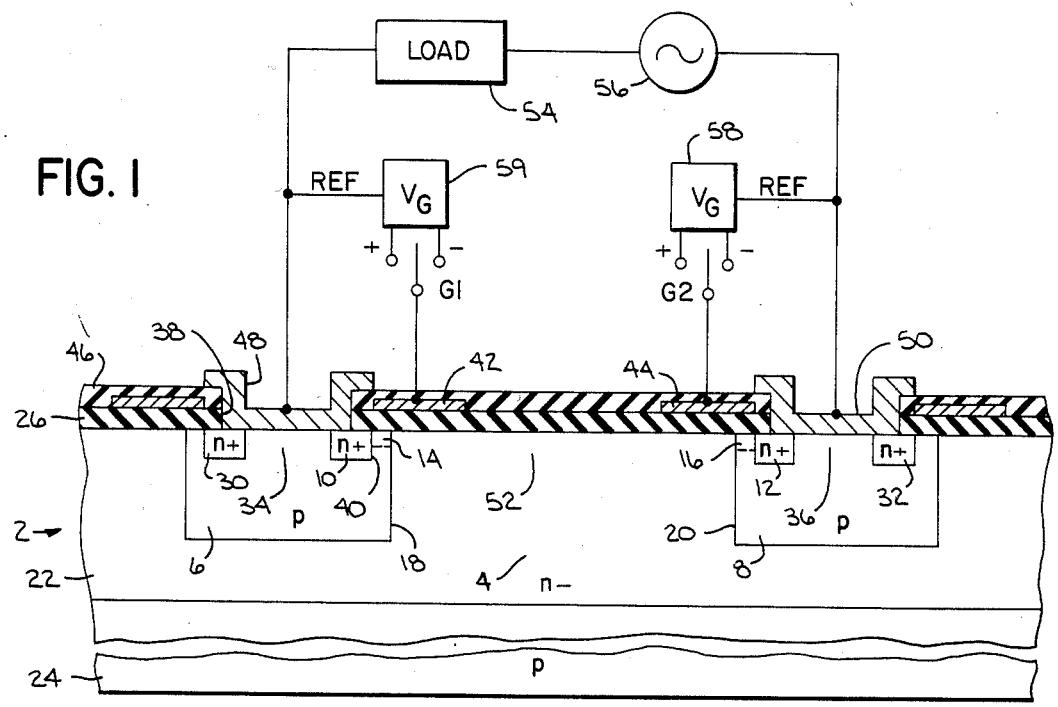
FIG. 1 is a schematic sectional view for illustrating the gating technique of the present invention.

FIG. 1 shows a split gate bidirectional power FET 2 having a common drift region 4 between a pair of spaced first and second channel-containing regions 6 and 8 and first and second source regions 10 and 12. During the OFF state, one of the first and second channels 14 and 16 is gated ON to short an otherwise forward biased junction between the one channel-containing region and the drift region, to prevent minority carrier injection and consequent bipolar action.

For example, if left source region 10 is positive with respect to right source region 12 during the OFF state, left channel 14 is gated ON to short an otherwise forward biased junction 18, to prevent minority carrier injection thereacross. The OFF state blocking voltage is dropped across reverse biased junction 20 between drift region 4 and the other channel-containing region 8. The OFF state blocking voltage is higher without the forward biased injection junction 18 and the bipolar action therefrom.

The gating ON of channel 14 during the OFF state also attracts given polarity carriers in drift region 4 adjacent channel 14 to prevent unwanted inversion to the other polarity along an induced depletion path through drift region 4. This further enhances OFF state voltage blocking capability.

Referring to FIG. 1, FET 2 includes a substrate 22 of semiconductor material of one conductivity type having a top major surface 24. In preferred form, substrate 22 is an n-epitaxial layer grown on a base layer of semiconductor material such as p layer 26. A pair of p tub regions 6 and 8 are diffused into substrate 22 through holes in silicon dioxide insulating layer 28 on top major surface 24. N+ regions 10, 30 and 12, 32 are diffused into p regions 6 and 8 through the same holes in the oxide layer, in accordance with known double diffusion processing technology. N+ regions 10, 30 are prevented from forming in the central section 34 of p region 6 by a separate masking step, or in accordance with known SIPMOS processing technology, and likewise for central section 36 of p tub 8. Both the p and the n+ diffusions are performed through the same hole, and thus the oxide edge such as 38 provides aligned registry. The diffusion parameters control the laterial penetration of p edge 18 and n+ edge 40, which in turn control the lateral length of channel 14 therebetween, and likewise for channel 16. Laterally spaced split gate electrodes 42 and 44 are deposited through an appropriate mask, followed by a top silicon dioxide insulating layer 46. Split gate electrodes 42 and 44 are insulated above and extend across respective channels 14 and 16. Main electrodes 48 and 50 are deposited in respective openings to ohmically contact respective source regions 10, 30 and 12, 32 and respective channel-containing regions 6 and 8.

In operation, for turn-on, upon application of positive voltage to right gate electrode 44 with respect to right main electrode 50, electrons in p region 8 are attracted to top major surface 24 to invert the conductivity type in channel 16 to n type. Likewise upon application of positive voltage to left gate electrode 42 with respect to left main electrode 48, electrons in p region 6 are attracted to top major surface 24 to invert the conductivity type in channel 14 to n type. If left main electrode 48 is positive with respect to right main electrode 50, current may then flow from left main electrode 48, through source region 10, through left channel 14, through drift region 4 along conduction path 52 beneath top major surface 24, then through right channel 16, through right source region 12, to right main electrode 50. The current is unipolar, i.e. consists only of majority carrier flow.

The structure is bidirectional, and thus current may also flow from right main electrode 50 to left main electrode 48 when the gates are turned ON, i.e. made positive with respect to their respective main electrodes.

In the OFF state, current from left main electrode 48 to right main electrode 50 is blocked by reverse biased PN junction 20. Right gate electrode 44 is turned off, i.e. biased at or below the potential of right main electrode 50, so that channel 16 is p type. Current flow in the other direction from right main electrode 50 to left main electrode 48 is blocked by junction 18, with the left gate electrode 42 being turned OFF such that channel 14 is p type.

In accordance with the gating technique of the present invention, during the OFF state, the gate electrode corresponding to the forward biased junction is turned ON to short such junction. For example, if left main electrode 48 is positive with respect to right main electrode 50 during the OFF state, then left gate electrode 42 is turned ON by making it positive with respect to left main electrode 48. Positive left gate electrode 42 attracts electrons in p region 6 towards the major surface 24 to invert channel 14 to n type and allow majority carrier flow therethrough between source region 10 and drift region 4, which shorts junction 18 and prevents minority carrier injection thereacross.

Minority carrier injection across forward biased junction 18 is undesirable in the OFF state because of the consequent bipolar PNP action between regions 6, 4 and 8. This bipolar action reduces the OFF state voltage blocking capability. By shorting junction 18 and preventing minority carrier injection thereacross, the OFF state voltage is dropped single reverse biased PN junction 20. This reverse biased junction can support higher OFF state voltage without the injection and bipolar action from junction 18.

In the analogy of a bipolar PNP transistor, the OFF state blocking voltage of FET 2 with channel 14 turned OFF is $V_{ceo}$. This is the voltage supported from collector 8 to emitter 6 with an open base 4. With channel 14 turned ON during the OFF state, the blocking voltage is $V_{cbo}$, which is the voltage supported across collector 8 to base 4 with an open emitter. $V_{cbo}$ is greater than $V_{ceo}$.

OFF state operation is comparable for the other polarity, i.e. when right main electrode 50 is positive with respect to left main electrode 48, Right gate electrode 44 is turned ON by making it positive with respect to right main electrode 50. Positive right gate electrode 44 attracts electrons in p region 8 towards top major surface 24 to invert channel 16 to n type and allow majority carrier flow therethrough between source region 12 and drift region 4, which shorts forward biased junction 20 and prevents minority carrier injection thereacross and consequent bipolar action between regions 8, 4 and 6. The OFF state voltage is dropped across single reverse biased PN junction 18, thus affording higher OFF state voltage blocking capability.

It is thus seen that in the OFF state gating technique of the present invention, the bipolar PNP action between regions 6, 4, and 8 has been eliminated. Instead a single reverse biased PN junction blocks the OFF state voltage, and thus affords higher OFF state voltage blocking capability.

OFF state voltage blocking capability is further enhanced by preventing unwanted polarity inversion along an induced depletion path through the drift region. For example, during the OFF state when left main electrode 48 is positive with respect to right main electrode 50, and left gate electrode 42 is turned ON, electrons in drift region 4 are attracted toward top major surface 24 adjacent channel 14 beneath left gate electrode 42. These electrons prevent inversion to p type polarity along an otherwise potentially induced depletion path 52. If such induced p type path were to extend all the way rightwardly to region 8, the device would loose its OFF state voltage blocking capability. Operation in the opposite polarity OFF state is comparable.

In accordance with an ON state gating technique disclosed in copending application Ser. No. 608,403 filed May 9, 1984, after initial field effect turn-on, one of the gates is turned OFF to provide bipolar conduction. For example, with FET 2 turned ON and current flowing from left main electrode 48 to right main electrode 50, left gate electrode 42 is turned OFF by making it negative with respect to left main electrode 48. Negative left gate electrode 42 attracts holes in p region 6 to thus revert channel 14 back to p type, thus rendering channel 14 nonconductive. Current instead flows across junction 18 by means of minority carrier injection of holes from p region 6 into drift region 4. This bipolar conduction provides desirable lower ON state resistance. Furthermore, the injection across forward biased PN junction 18 provides a larger area current source than point 14, and thus uses more of substrate 4, not just the narrow conduction path 52 beneath top major surface 24. The injection across forward biased junction 18 affords conductivity modulation through substrate 4 and bipolar action at reversed biased junction 20. Channel 14 is then gated back ON to again afford field effect conduction therethrough between source regions 10 and 12, to enable fast turn-off.

Bidirectional FET 2 may be used to control AC power. FIG. 1 schematically shows a load 54 and a source of AC power 56 connected across main electrodes 48 and 50. During the first halfcycle of AC source 56, with left main electrode 48 positive with respect to right main electrode 50, switch G2 is in its leftward position such that gating potential source 58 biases right gate electrode 44 positively with respect to reference main electrode 50. Channel 16 is thus inverted to n type. For fast turn-on, switch G1 is in its leftward position such that left gate electrode 42 is biased positively with respect to left main electrode 48 by gating potential source 59. Channel 14 is thus inverted to n type and conduction occurs as above described. In an alternative, if left gate electrode 42 is not biased positively with respect to left main electrode 48, then current initially flows across forward biased PN junction 18. As soon as current starts to flow through the FET, the voltage across the main electrodes drops, which in turn reduces the potential in various regions of the FET including the portion of p region 6 below channel 14, which dropping potential may become negative relative to left gate electrode 42, whereby the latter attracts electrons toward top major surface 24 to invert channel 14 to n type and hence render channel 14 conductive.

Still during the first halfcycle, after initial turn-on, G1 is switched to its rightward position such that left gate electrode 42 is made negative with respect to left main electrode 48. This reverts channel 14 back to p type and thus forces current across forward biased PN junction 18, causing the above noted minority carrier injection and bipolar conduction. Before the end of the first halfcycle, G1 is again switched to its leftward position making left gate electrode 42 positive with respect to left main electrode 48, and again inverting channel 14 back to n type to thus short junction 18, and to provide field effect conduction. This field effect conduction enables fast turn-off at the end of the first halfcycle. ON state operation during the second halfcycle, with current flow leftwardly from right main electrode 50 to left main electrode 48, is comparable.

In the OFF state during the first halfcycle with left main electrode 48 positive with respect to right main electrode 50, G2 is in its rightward position such that right gate electrode 44 is biased at or below the potential of right main electrode 50. Right channel 16 is thus not inverted to n type, but instead remains p type polarity. Junction 20 is thus not shorted, and is a reverse biased blocking junction. G1 is switched to its leftward position to turn ON left gate electrode 42 by making it positive with respect to left main electrode 48. Positive gate electrode 42 attracts electrons in p region 6 to invert channel 14 to n type such that majority carrier unipolar field effect current may flow between source region 10 and drift region 4 through channel 14 without crossing junction 18, thus shorting junction 18 and preventing minority carrier injection thereacross. The OFF state voltage is thus dropped across the reverse biased junction 20 between drift region 4 and the other channel-containing region 8 without minority carrier injection and bipolar action across forward biased junction 18.

In the OFF state during the second halfcycle, G1 is in its rightward position and G2 is in its leftward position such that channel 16 is conductive and shorts forward biased junction 20 to prevent minority carrier injection thereacross. The OFF state voltage is blocked by reverse biased junction 18.

The gating technique of the invention may be used in a multi-cell matrix array incorporating a plurality of bidirectional power FETs integrated on a common substrate. For example, region 30 is part of the next FET cell to the left, and region 32 is part of the next FET cell to the right. Multi-cell gating is shown in FIG. 2, together with various alternatives.

Figure 2:
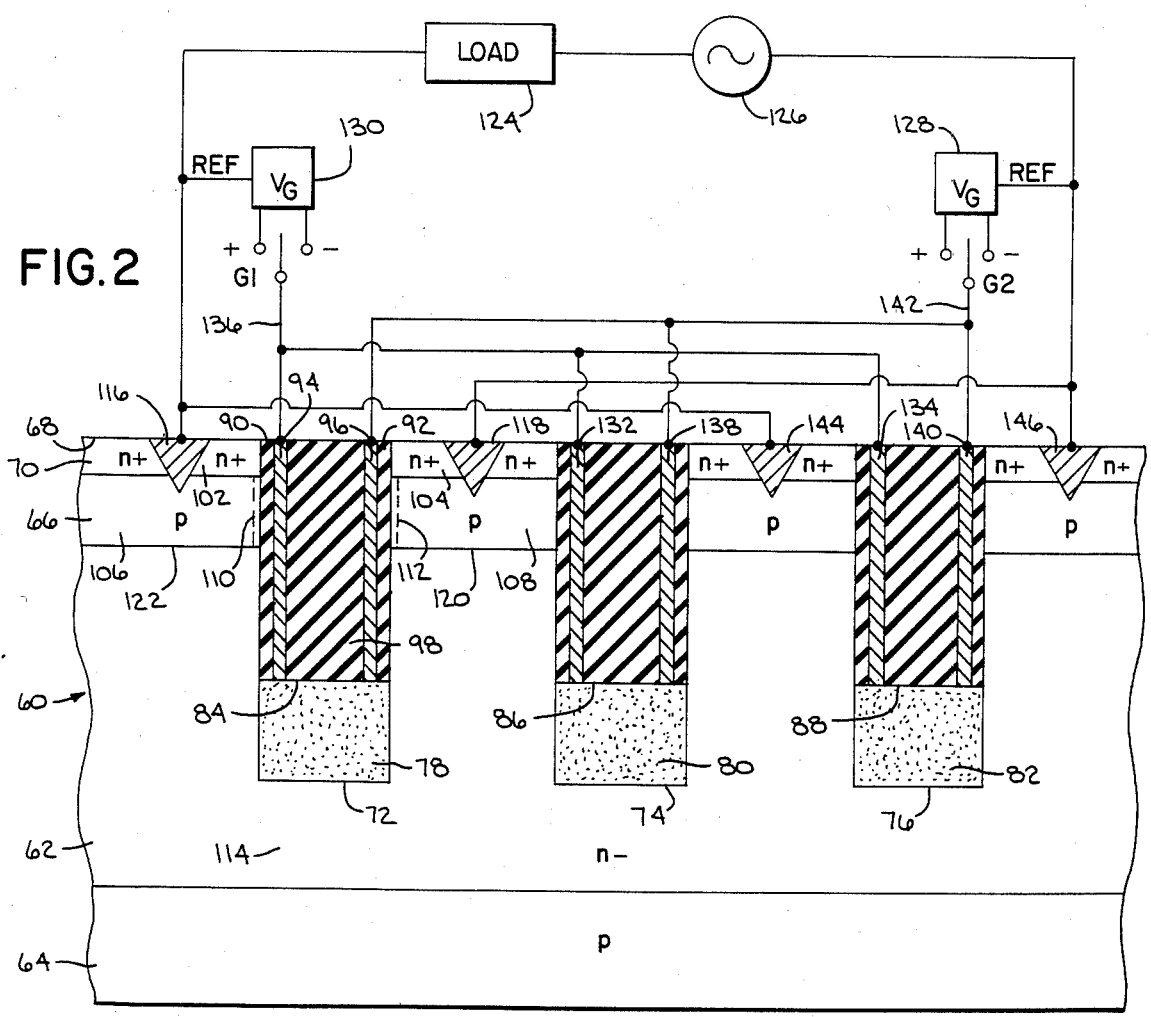
FIG. 2 shows an alternate embodiment.

FIG. 2 shows bidirectional power FET 60 including a substrate 62 of one conductivity type, such as n type, having a bottom layer 64 of opposite conductivity type, such as p type. A top p layer 66 is diffused or grown into the substrate from top major surface 68 followed by ionimplatation and/or diffusion of an n+ top layer 70.

A plurality of notches 72, 74, 76, and so on, are formed in the substrate from top major surface 68 through n+ top layer 70 and through p top layer 66 into substrate region 62. These notches may be anisotropically etched, as known in the art: C. Hu, "A Parametric Study of Power MOS FETs", IEEE Electron Device Conference, Paper CH1461-3/79, 0000-0385; IEEE Transactions Electron Devices, Volume ED-25, No. 10, October, 1978; and Ammar and Rogers, "UMOS Transistors on Silicon", Transactions IEEE, ED-27, Pages 907–914, May, 1980. Alternatively, the notches may be formed by a porous silicon region in accordance with the known anodization technique of passing a fixed current through the localized region in the presence of concentrated hydrogen fluoride to create a structural change in the silicon which remains single crystalline with the substrate but becomes porous. In the case of anisotropic etching the bottom of the notch is filled with insulative material. In the case of anodization, the substrate is subjected to an oxidizing atmosphere such that the oxygen enters the pores in the porous notched regions and rapidly oxidized these regions as shown at 78, 80, 82 and so on, which regions are still single crystalline with substrate 62 but substantially nonconductive. Before or after the anodization, the notches are etched down to levels 84, 86, 88, and so on.

In notch 72, silicon dioxide insulating layers 90 and 92 are grown along the inner facing surfaces of the notch. First and second split gate electrodes 94 and 96 are then formed along the left and right vertical sides of the notch, as by shadow evaporation of conductive material such as aluminum from an angle or low pressure chemical vapor deposition (LPCVD) of polysilicon. Another insulating oxide layer 98 is provided in the middle of the notch between the gate electrodes, as by chemical vapor deposition. The insulated gating structure in notches 74 and 76 is comparable.

Notch 72 extends from top major surface 68 downwardly through top layers 70 and 66 into substrate region 62. Notch 72 separates top layer 70 into first and second left and right source regions 102 and 104 and extends therebetween. Notch 72 separates top layer 66 into first and second regions 106 and 108 containing left and right channels 110 and 112 and extends therebetween. Substrate 62 around the notch forms a drain or drift region 114 of the substrate. Main electrode metallization 116 is deposited on top major surface 68 in an etched groove to ohmically contact source region 102 and channel-containing region 106. Another main electrode metallization 118 is deposited on top major surface 68 in an ethced groove to ohmically contact source region 104 and channel-containing region 108. In an alternative, the etched groove for the main electrode metallization may extend downwardly into substrate 62 followed by deposition of a thin p layer along the inner surface of the groove followed by deposition of the main electrode metallization.

In ON state operation, upon application of positive voltage to left gate electrode 94 with respect to left main electrode 116, electrons in p region 106 are attracted to channel 110 to invert the conductivity type therein to n type. This allows electron flow from n+ source region 102 through channel 110 into drift region 114 in substrate 62. If right main electrode 118 is positive with respect to left main electrode 116, current may then flow from p region 108 across forward biased PN junction 120, or current may flow through channel 112 from source 104 if the channel is inverted to n type by a positive voltage on right gate electrode 96 relative to right main electrode 118. The main current path through FET 60 at turn-on is from right main electrode 118 through right source region 104, downwardly through right vertical channel 112 along the right side of notch 72, then further downwardly into drift region 114 along the right side of the notch, then around the bottom of notch 72, then upwardly along the left side of the notch in drift region 114 of substrate 62, then upwardly through left vertical channel 110 along the left side of notch 72, then through left source 102 to left main electrode 116.

During initial fast turn-on, current flow is unipolar due to the field effect action. Electrons are the majority carriers and the sole current carrier flow. Electrons flow from n region 102 through an induced n region 110, through n region 62, through induced n region 112, through n region 104.

After initial field effect turn-on, the device may be switched to a bipolar mode as above noted. Bipolar action is effected by making right gate electrode 96 negative with respect to right main electrode 118. The relatively negative right gate electrode 96 attracts holes in p region 108 towards the right side of notch 72 and causes channel 112 to revert back to p type, thus causing current to cross junction 120. Current crosses junction 120 by means of minority carrier injection, thus effecting bipolar conduction. Current flows by means of both majority and minority carrier flow. Prior to turn-off, gate 96 is turned back ON, i.e. made positive with respect to right main electrode 118, to thus invert channel 112 back to n type. This affords field effect conduction again, enabling fast turn-off. The structure is bidirectional, and thus current may also flow from left main electrode 116 to right main electrode 118 comparably to that above described.

In the OFF state of FET 60, junction 122 blocks current flow from right main electrode 118 to left main electrode 116. Left channel 110 is gated OFF, and right channel 112 is gated ON. Forward biased PN junction 120 is thus shorted by conductive channel 112, to prevent minority carrier injection thereacross. This in turn prevents bipolar PNP action between regions 108, 62 and 106. The OFF state voltage is blocked by reverse biased junction 122, the latter having a higher voltage capability without the minority carrier injection and bipolar action from junction 120 through substrate 62.

Junction 120 blocks current flow in the reverse direction during the OFF state when left main electrode 116 is positive with respect to right main electrode 118. Channel 112 is turned OFF, and channel 110 is turned ON. Forward biased PN junction 122 is shorted by conductive channel 110, to prevent minority carrier injection and bipolar action. The voltage is dropped across reverse biased junction 120, without PNP bipolar action between regions 106, 62 and 108.

As with power FET 2, FET 60 may be used to control AC power. FIG. 2 shows a load 124 and a source of AC power 126 connected across main electrodes 116 and 118. Gating potential sources 128 and 130 operate analogously to voltage sources 58 and 60, respectively.

As seen in FIG. 2, a plurality of FETs are afforded in the integrated structure. Top layers 66 and 70 are further split into respective left and right source regions and channel-containing regions by further notches 74 and 76. Main electrode metallizations are provided comparably to that described, and connected in series in the AC load line, or in parallel as shown in FIG. 2. Left gate electrodes 132 and 134 are connected in parallel with left gate electrode 94 to left gate terminal 136. Right gate electrodes 138 and 140 are connected in parallel with right gate electrode 96 to right gate terminal 142.

In one of the halfcycles of AC source 126, main electrode 118 provides the source electrode for the FET to the left around notch 72, and also provides the source electrode for the FET to the right around notch 74. Main electrode 144 provides the drain electrode for the FET around notch 74 and also provides the drain electrode for the FET around notch 76. In the other halfcycle of AC source 124, the roles of electrodes 118 and 144 are reversed, i.e. electrode 118 is the drain for its left and right FETs around respective notches 72 and 74, and electrode 144 is the source for its left and right FETs around respective notches 74 and 76. Alternate main electrodes 116, 144 and so on, are thus connected to one side of the AC source, and the other alternate main electrodes 118, 146 and so on, are connected to the other side of the AC source.

It is recognized that various modifications are possible within the scope of the appended claims.

We claim:

1. In a split-gate bidirectional power FET having a common drift region of one conductivity type in a semiconductor substrate between a pair of spaced first and second channel-containing regions of opposite conductivity type in said semiconductor substrate, forming first and second PN junctions with said common drift region respectively and extending to a surface of said semiconductor substrate and first and second source regions of said one conductivity type adjacent to said first and second channel-containing regions respectively and forming third and fourth PN junctions therewith respectively, first and second main electrodes contacting said first source and channel-forming regions and contacting said second source and channel-forming regions respectively, first and second insulated gate electrodes on said surface of said first and second channel-containing regions respectively and extending between said common drift region and the adjacent source region, a source of alternating voltage impressed across said first and second main electrodes such that one of said first and second PN junctions is a forwardly biased injection junction and the other of said first and second PN junctions is a reverse biased junction, an improved gating technique providing increased OFF state voltage blocking capability comprising providing a gate control voltage to one of said first and second gate electrodes which is adjacent to said one forwardly biased injection junction of sufficient intensity to create a one inversion channel region between said common drift region and the adjacent source region to prevent minority carrier injection and consequent bipolar action, the OFF blocking voltage being dropped across said other reverse biased junction between said common drift region and the other channel-containing region, said OFF state blocking voltage being higher without said forward biased injection junction and the bipolar action therefrom.

2. The invention according to claim 1 wherein the gating ON of said one channel also attracts given polarity carriers in said drift region adjacent said one channel to prevent unwanted inversion to the other polarity along an induced depletion path through said drift region, whereby to further enhance OFF state voltage blocking capability.

3. The invention according to claim 2 wherein:
said channels extend horizontally along a top major surface between a respective said source region and said drift region; and
said gate electrodes extend horizontally along said top major surface above respective said channels.

4. The invention according to claim 3 wherein:
said channel-containing regions are laterally spaced by said drift region extending upwardly between said channel-containing regions to a top major surface of said FET;
said source regions are laterally spaced along said top major surface; and
said channels and said drift region are disposed between said source regions.

5. The invention according to claim 2 comprising notch means extending between and separating said first source and channel-containing regions from said second source and channel-containing regions, and extending into said common drift region.

6. The invention according to claim 5 wherein:
said channel-containing regions are laterally spaced by said notch means;
said notch means extends downwardly from a top major surface of said FET;
said channels extends generally vertically along said respective sides of said notch means; and
said drift region is below said channels.

7. The invention according to claim 6 wherein:

said source regions are laterally spaced along said top major surface by said notch means therebetween; and said source regions are above respective said channels.

8. The invention according to claim 7 wherein the drift region current path between said main electrodes extends from said source regions downwardly through said channels and downwardly and around the bottom of said notch means.

* * * * *